US012749648B2

(12) United States Patent
Levy et al.

(10) Patent No.: US 12,749,648 B2
(45) Date of Patent: Sep. 29, 2026

(54) DISCHARGING A REGION OF A SAMPLE

(71) Applicant: Applied Materials Israel Ltd., Rehovot (IL)

(72) Inventors: Roey Levy, Rehovot (IL); Shachar Faigenblat, Rehovot (IL); Alexander Goldenshtein, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 371 days.

(21) Appl. No.: 18/210,594

(22) Filed: Jun. 15, 2023

(65) Prior Publication Data

US 2024/0420917 A1 Dec. 19, 2024

(51) Int. Cl.

*H01J 37/22* (2006.01)
*H01J 37/26* (2006.01)
*H01J 37/28* (2006.01)

(52) U.S. Cl.

CPC .......... *H01J 37/226* (2013.01); *H01J 37/265* (2013.01); *H01J 37/28* (2013.01); *H01J 2237/2817* (2013.01)

(58) Field of Classification Search

CPC ... H01L 22/12; H01J 2237/2817; H01J 37/00; H01J 37/02; H01J 37/26; H01J 37/28; H01J 37/265; H01J 37/226; H01J 37/075; G01N 2223/6116; G01N 2223/418; G01N 2223/401; G01N 2223/335; G01N 2223/053; G01N 23/2251; G01N 23/203; G01B 2210/56; G01B 15/00

USPC ................................ 250/306, 307, 310, 311

See application file for complete search history.

(56) References Cited

U.S. PATENT DOCUMENTS

| | | | | |
|---|---|---|---|---|
| 6,465,781 | B1 * | 10/2002 | Nishimura .............. | H01J 37/28 250/311 |
| 6,674,075 | B2 | 1/2004 | Petrov et al. | |
| 7,847,267 | B2 | 12/2010 | Shemesh et al. | |
| 2005/0029451 | A1 * | 2/2005 | Nagahama .............. | H01J 37/28 250/310 |
| 2008/0203298 | A1 * | 8/2008 | Ishijima ............... | G01N 23/225 250/311 |
| 2008/0315093 | A1 * | 12/2008 | Hasegawa ............ | H01J 37/026 250/372 |
| 2012/0217391 | A1 | 8/2012 | Shichi et al. | |
| 2016/0343534 | A1 * | 11/2016 | Wang .................... | H01J 37/026 |

(Continued)

FOREIGN PATENT DOCUMENTS

| | | |
|---|---|---|
| CN | 217824913 U | 11/2022 |
| TW | 201430902 A | 8/2014 |

OTHER PUBLICATIONS

TW113121839, “Office Action”, Jun. 10, 2025, 6 pages.
TW113121839, “Office Action”, Feb. 11, 2026, 9 pages.
KR10-2024-0077563, “Office Action”, Apr. 28, 2026, 5 pages.

*Primary Examiner* — Jason L McCormack

(74) *Attorney, Agent, or Firm* — Kilpatrick Townsend & Stockton LLP

(57) ABSTRACT

A system for discharging a region of a sample, the system includes (i) illumination optics that is configured to discharge the region by illuminating the region of the sample with a laser pulse during an illumination iteration; and (ii) a timing circuit that is configured to trigger the illumination iteration to occur at a timing that is based on one or more timing constraints associated with a scanning of the region by an electron beam.

15 Claims, 9 Drawing Sheets

(56) References Cited

U.S. PATENT DOCUMENTS

| | | | | |
|---|---|---|---|---|
| 2022/0359152 | A1* | 11/2022 | Ehberger | H01J 37/10 |
| 2023/0335374 | A1* | 10/2023 | Gaury | H01J 37/244 |

* cited by examiner 200-3

200-4

600

DISCHARGING A REGION OF A SAMPLE

BACKGROUND OF THE INVENTION

A sample may be evaluated by scanning one or more regions of the sample with an electron beam. The sample may be a semiconductor wafer that includes multiple dies. Other samples may be provided.

A sample may include a vast number of structural elements of microscopic scale. For example, a sample may include structural elements having dimensions that are less than 10 microns, less than 1 micron, less than one hundred nanometers, and even below one hundred nanometers.

Various regions of the wafer may be scanned during one or more types of wafer evaluations. The scanning can be executed by a charged particle evaluation system.

A defect review (DR) scanning electron microscope may scan multiple regions of the sample in order to review suspected defects.

A critical dimension (CD) scanning electron microscope may scan multiple regions of the sample in order to measure critical dimensions.

A metrology system may scan multiple regions and measure structural elements located within the multiple regions of the sample.

An electron beam inspection system may scan multiple regions and inspect elements located within the multiple regions of the sample.

A single scan of a region (that includes one or more structural elements of interest) may provide a frame which may exhibit a relatively low signal to noise ratio. In order to improve the signal to noise ratio, the region is scanned multiple times (for example between 10 and 50 times, between 20 and 30 times, and the like) to provide multiple frames.

The multiple frames are processed (for example are added to each other or averaged) to provide a single image of the region. The single image exhibits a much higher signal to noise ratio than the single frame.

The region usually includes non-conductive elements or only partially conductive elements (such as semiconductors, dielectric materials, and the like).

The scanning of a region that includes non-conductive elements or only partially conductive elements charges the surface of the region.

The charging of the surface of the region may reduce the quality of the frame and may reduce the quality of the image.

There is a growing need to discharge the surface of the region.

BRIEF SUMMARY OF THE INVENTION

There is provided a system for discharging a region of a sample, the system includes (a) illumination optics that is configured to discharge the region by illuminating the region of the sample with a laser pulse during an illumination iteration; and (b) a timing circuit that is configured to trigger the illumination iteration to occur at a timing that is based on one or more timing constraints associated with a scanning of the region by an electron beam.

There is provided a method for discharging a region of a sample, the method includes (a) triggering, by a timing circuit, an illumination iteration to occur at a timing that is based on one or more timing constraints associated with a scanning of the region by an electron beam; and (b) discharging, by illumination optics, the region by illuminating the region of the sample with a laser pulse during the illumination iteration.

There is provided a non-transitory computer readable medium that stores instructions that once executed by a timing circuit, causes the timing circuit to: (a) trigger an illumination iteration to occur at a timing that is based on one or more timing constraints associated with a scanning of the region by an electron beam; wherein the illumination iteration includes discharging, by illumination optics, the region by illuminating the region of the sample with a laser pulse.

BRIEF DESCRIPTION OF THE DRAWINGS

The subject matter regarded as the invention is particularly pointed out and distinctly claimed in the concluding portion of the specification. The invention, however, both as to organization and method of operation, together with specimen s, features, and advantages thereof, may best be understood by reference to the following detailed description when read with the accompanying drawings in which:

Figure 1:
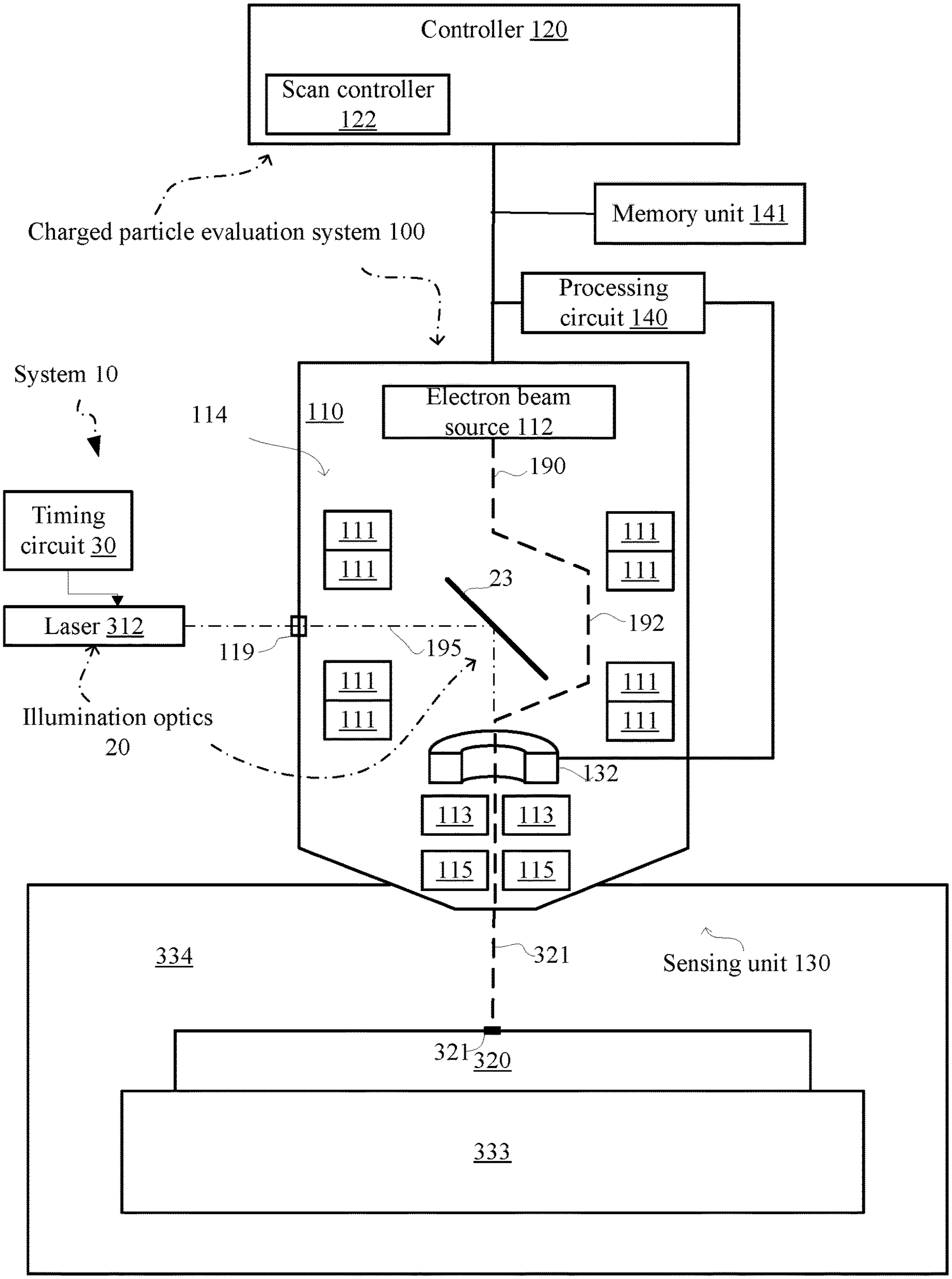
FIG. 1 illustrates an example of a system for discharging a region of a sample, and of an environment of the system.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using optical and/or electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method and should be applied mutatis mutandis to a computer program product that stores instructions that once executed result in the execution of the method.

Any reference in the specification to a system should be applied mutatis mutandis to a method that may be executed by the system should be applied mutatis mutandis to a computer program product that stores instructions that can be executed by the system.

Any reference in the specification to a computer program product should be applied mutatis mutandis to a method that may be executed when executing instructions stored in the computer program product and should be applied mutandis to a system that is configured to executing instructions stored in the computer program product.

The term and/or means additionally or alternatively. For example A and/or B means only A, or only B or A and B.

It has been found that a region that is scanned by an electron beam may be discharged using light.

The region is scanned by an electron beam using a scan pattern that includes one or more idle periods during which the region is not illuminated by the electron beam. A single scan of the region (following the scan pattern) may result in a single frame. Multiple frames may be generated during a scan session to be processed and provide a single image of the region.

A line of a region is a sub-region that is illuminated by the electron beam when the electron beam linearly scans the region. The width of the line is the width of a spot formed by the electron beam on the region. The length of the line is mainly determined by the length of the linear scan.

In an example of a scan pattern, a line of the region is scanned with the electron beam, from left to right, till reaching the right end of the line. After reaching the right end of the line, the electron beam is turned off and is directed back to a left end of the next line. After reaching the left end of the next line, the electron beam scans the next line until reaching the right end of the next line.

The region may be discharged during an illumination iteration.

The illumination iteration may occur during an idle period.

The illumination iteration may be shorter than the idle period (for example be of a duration of that ranges between 10-95 percent of the idle period, be of duration that ranges between 30-80 percent of the idle period, and the like).

Multiple illumination iterations may occur during a scanning of the region with an electron beam, for example, an illumination iteration may occur after each line of the region is scanned), or may occur during only some of the idle periods that occur during a scan of the region, for example, once per a first number (N1) of scan lines.

The time difference between adjacent illumination iterations may be determined by an operator of the scanning electron microscope, by a manufacturer of the scanning electron microscope, or any authorized person.

The time difference between adjacent illumination iterations may remain unchanged, or may be changed over time.

The time difference may be determined based on the charging state of sample. For example—a first region of the sample that is charged faster than a second region of the sample may require more frequent illumination iterations than the second region.

The time difference between adjacent illumination iterations may equal a product of multiplication between N1 and a time difference between the scanning of consecutive lines of the sample.

Non limiting examples of the value of N1 are four, five, six, seven, eight, nine, ten, fifteen, and more.

FIG. 1 illustrates an example of a system 10 for discharging a region of a sample, and of an environment of system 10.

Discharging a region of the sample involve reducing the charging of the surface of the region. The reduction may discharge the entire charge or may reduce the charge without nullifying the charge.

The environment of the system includes a charged particle evaluation system 100. The charged particle evaluation system 100 uses charged particles to evaluate a sample.

The charged particle evaluation system may be (i) a defect review scanning electron microscope SEMVISION™ of APPLIED MATERIALS™ Inc. of San Jose, California, (ii) a metrology system such as the PROVision™ 3E Ebeam™ metrology system of APPLIED MATERIALS™, (iii) an electron beam inspection system such as the PRIMEVISION™ of APPLIED MATERIALS™, or (iv) a critical dimension scanning electron microscope such as the VERITYSEM™ of APPLIED MATERIALS™, and the like. The charge particle evaluation system may manufactured by vendors such as HITACHI™ of Tokyo, Japan, or KLA™ Corporation of Milpitas, California, or may be manufactured by other vendors.

According to one or more embodiments, system 10 includes illumination optics 20 that is configured to discharge the region by illuminating the region of the sample with one or more laser pulses during an illumination iteration.

System 10 also includes a timing circuit 30 that is configured to trigger the illumination iteration to occur at a timing that is based on one or more timing constraints associated with a scanning of the region by an electron beam.

FIG. 1 illustrates the illumination optics 20 as including:

a. Laser 312 that is located outside column 110 of the scanning electron microscope and is configured to generate one or more laser pulses.

b. Mirror 23 that is located within the column 110 and is configured to receive the one or more laser pulses through a window 119 that is formed in the column 110, and to direct the one or more laser pulses towards a region of a sample that is scanned by an electron beam generated by the column 110, during one or more illumination iterations.

The illumination optics 20 may include one or more additional optical components such as focusing lenses, collimators, polarization control elements, and the like.

The charged particle evaluation system 100 includes:

a. Column 110.
b. Memory unit 141 for storing instructions and data.
c. Controller 120 that includes scan controller 122 that is configured to generate control signals that control the scanning of a region by an electron beam.
d. A sensing unit 130 that may include one or more sensors.
e. A processing circuit 140 that is configured to convert sensor signals to frames and to images. The processing circuit 140 may include an array of integrated circuits such as graphic processors, general purpose processors, and the like.
f. Vacuum chamber 334 in which the sample is located.
g. Mechanical stage 333 for supporting the sample and moving the sample.

The column 110 includes electron optics such as electron beam source 112 and electron beam manipulation optics 114.

The electron beam manipulation optics 114 is configured to propagate the electron beam 321 through the column (for example while bypassing mirror 23) till exiting from the column.

The electron beam manipulation optics 114 may include deflection lenses, focusing lenses, electron beam collimating optics, electron beam shaping optics, and the like. Examples of a column 110 that includes multiple deflection coils for double-deflecting an electron beam are illustrated in U.S. Pat. No. 7,847,267 of Shemesh et al.

FIG. 1 illustrates the electron beam manipulation optics 114 as including:

a. Bypass magnetic scan coils 111 that are configured to direct the electron beam along a bypass path that bypasses mirror 23.
b. Objective lens 113 that is configured to focus the electron beam on the region 231 of sample 230.
c. Deflector lenses 115 for deflecting the electron beam according to a scan pattern.

The optical axis 191 of the electron beam 190 is a vertical axis through which the electron beam propagated before the bypassing of the mirror and after the bypassing of the mirror.

The bypass magnetic scan coils 111 are configured to: (i) tilt the electron beam at a first direction, (ii) tilt the electron beam at an opposite direction such as to propagate along a secondary optical axis 192 that is parallel to the optical axis but spaced apart from the optical axis, (iii) tilt the electron beam at a second direction, towards the optical axis, and (iv) tilt the electron beam, at a direction opposing the second direction, such as to propagate along the optical axis. A system and method for double tilt is described at U.S. Pat. No. 6,674,075 of Petrov et al. and is incorporated herein by reference.

The charged particle evaluation system may also include a vacuum system (not shown) configured to maintain the column is maintained in vacuum, a high power supply unit (not shown) configured to provide high voltage signals to accelerate the electron beam and to decelerate the electron beam.

The sensing unit 130 also include one or more detectors. The one or more detectors may include secondary electron detectors, backscattered electron detectors. Detectors for detecting photons and additionally or alternatively x-rays may also be included in the charged particle evaluation system. Examples of a column 110 that includes multiple sensors are illustrated in U.S. Pat. No. 7,847,267 of Shemesh et al.

Any detector of the charged particle evaluation system may be located within the column or outside the column. A detector may include a single sensing segment, may include multiple sensing segments, may be a part of an array of sensors, and the like.

FIG. 1 illustrates a secondary electron sensor 132 that is located within the column 110.

The sample 320 is supported and moved by a mechanical stage 333.

The timing circuit 30 includes one or more integrated circuits. In one embodiment the timing circuit is implemented by a Field Programmable Gate Array (FPGA). It should be noted that the timing circuit can be implemented by an Application Specific Integrated Circuit (ASIC), may be implemented by a hardware accelerator, by a central processing unit, by a microcontroller, and the like.

There may be multiple idle periods per a scanning period. A scanning period is a period during which the region is scanned.

The timing circuit may trigger one or more illumination iterations during the scanning period-especially during one or more idle periods of a scanning period. For example—the illumination iterations may be triggered once per N1 idle periods.

The timing circuit may trigger any illumination iteration based on one or more timing constraints. The one or more timing constraints may include at least one out of (a) a time difference between adjacent illumination iterations of the different illumination iterations—for example a time required to scan N1 lines of the region, (b) the timing of one or more idle periods, and the like.

A timing of an idle period may include at least one of a start of the idle period, the entire duration of the idle period, a part of the duration of the idle period, or an end of the idle period.

The charged particle evaluation system may include a field of view that includes a group of regions. Thus, the charged particle evaluation system may scan each one of the regions of the groups of regions by deflecting the electron beam, and without introduction of a mechanical movement between the sample and the column 110.

If the laser pulse illuminates the entire field of view (all regions of the group of regions), then the mirror 23 does not need to tuned to illuminate the specific region that is currently scanned by the electron beam, and the illumination optics may be fixed in the sense that they do not need to track the region that is currently being illuminated. In this case the mirror 23 may be a fixed mirror. Additionally or alternatively, the illumination optics do not need to have scanning or deflecting optics for directing the laser pulses onto a specific region within the field of view.

It may be beneficial to illuminate only a part of the field of view, for example, illuminating only the region that is being scanned, to provide more laser energy to the region and to speed the discharging of the region.

When only a part of the field of view is illuminated, the illumination optics may be adjustable and is configured to direct the light (laser pulses 195) only (or mostly) on a region that is scanned. In this case the mirror 23 may be a movable mirror (for example rotates about a rotation axis by an engine (not shown)) and additionally or alternatively the illumination optics may include other scanning or deflecting optics (such as not or more mirrors that are movable and additionally or alternatively rotatable in relation to each other) for directing the laser pulses onto a specific region within the field of view.

According to an embodiment of the disclosure, the timing circuit may generate timing signals during scan sessions and between scan sessions.

The timing signals generated by the timing circuit may include:

a. A first timing signal that is a periodic signal having a first period that equals a time difference between consecutive line scans.
b. A second timing signal that is a periodic signal having a second period that equals a time difference between consecutive illumination iterations.

Assuming that an illumination iteration is required each time N1 are scanned-then the second period is N1 times longer than the first period.

According to an embodiment of the disclosure the timing circuit may synchronize the generation of the first timing signal and the second timing signals with each scan of a region.

According to an embodiment of the disclosure the timing circuit may generate the first timing signal and the second timing signals in an uninterrupted manner-even between one scan session to another. The uninterrupted generation of the first timing signal and the second timing signals may simplify the generation of the timing signals any may improve the lifespan of the laser.

When generating the first timing signal and the second timing signals in an uninterrupted manner (even between one scan session to another), the scan controller 122 may align the start of a scanning of the region with the first timing signal.

Figure 2:
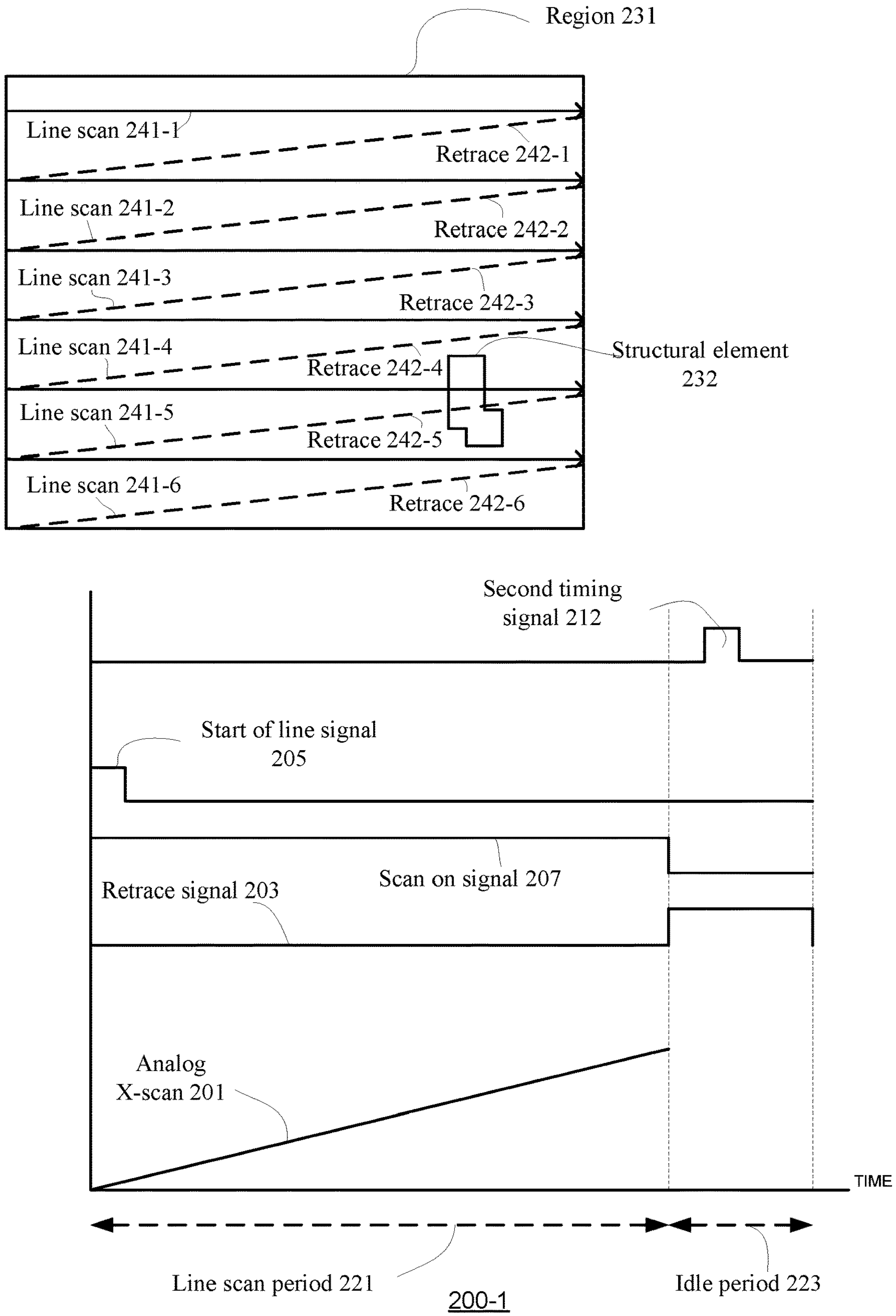
FIG. 2 illustrates an example of scanning a region and of signals generated during a scan of the region.

FIG. 2 illustrates an example of scanning a region 231 (that includes structural element 232) by a scan pattern that includes first line scan 241-1, first retrace 242-1, second line scan 241-2, second retrace 242-2, third line scan 241-3, third retrace 242-3, fourth line scan 241-4, fourth retrace 242-4, fifth line scan 241-5, fifth retrace 242-5, sixth line scan 241-6, and sixth retrace 242-6.

Assuming that N1 equals three, then two illumination iterations will occur during the scanning of region 231. The first illumination iteration may occur at either one of the first retrace period 242-1, the second retrace period 242-2 and the third retrace period 242-3. The second illumination iteration will occur three scan lines afterwards.

FIG. 2 also includes timing diagram 200-1 that illustrates line scan period 221, idle period 223, and various signals.

The various signals include control signals generated by the scan controller 122. The control signals may include:

a. Analog x-scan signal 201 (illustrated as determining the x-coordinate of the electron beam during a line scan, its value during the retrace is not shown for simplicity of explanation).
b. Retrace signal 203 that is set during each retrace period.
c. Scan on signal 207 that is set during the line scan.

The various signals also include second timing signal 212 that is generated by the timing circuit—and triggers an illumination iteration. The second timing signal is set only during idle periods in which an illumination iteration occurs, for example one per each N1 idle periods.

Figure 3:
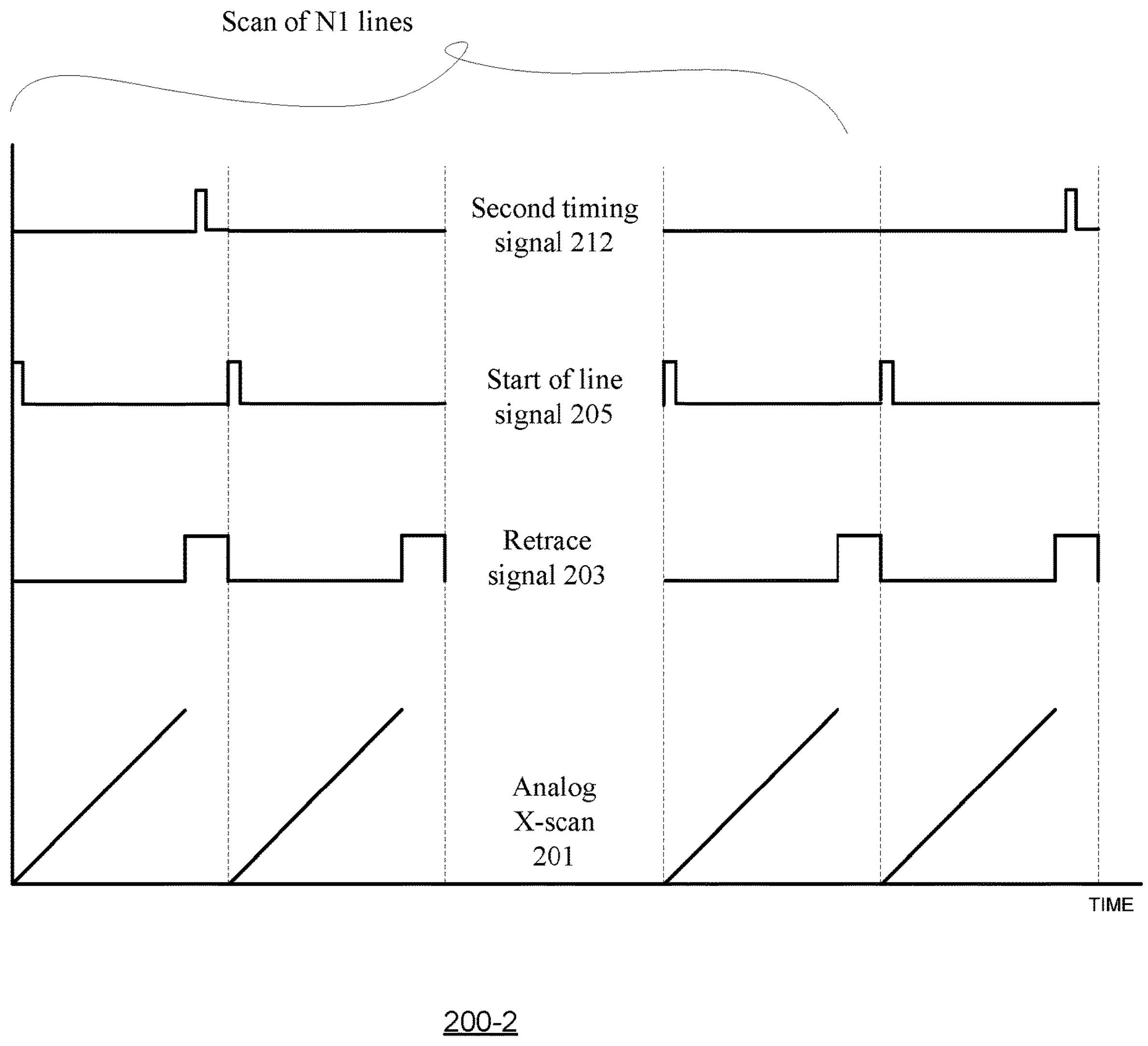
FIG. 3 illustrates an example of signals generated during scans of the region.

FIG. 3 includes timing diagram 200-2 that illustrates analog x-scan signal 201, retrace signal 203, scan on signal 207, and second timing signal 212, that is set once per N1 line scans.

Figure 4:
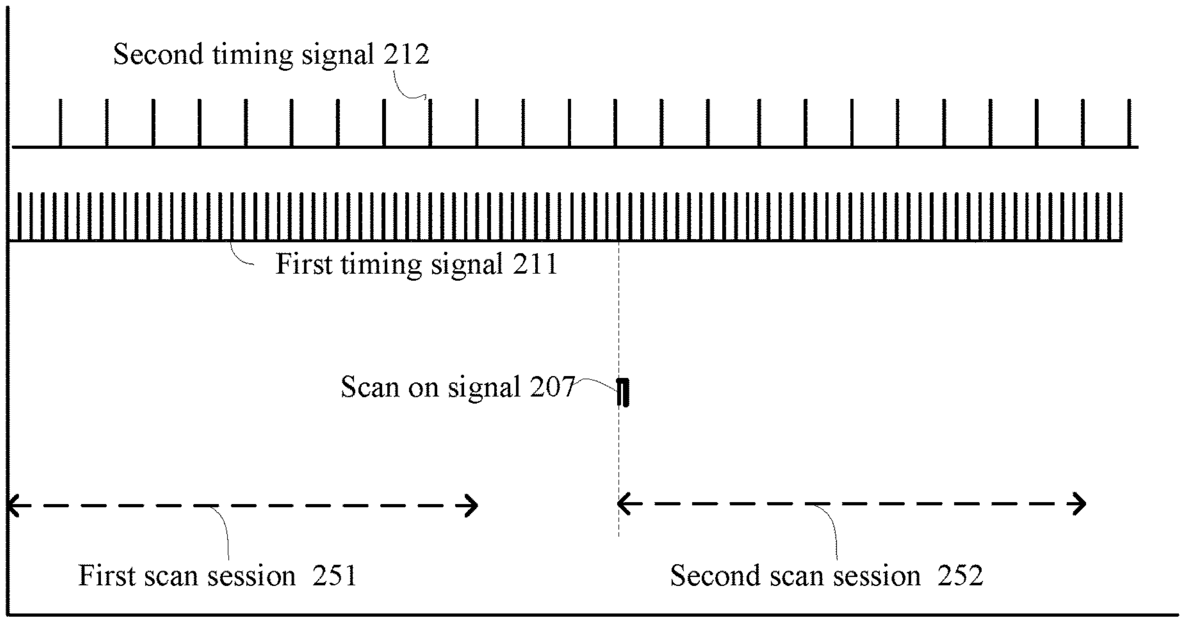
FIG. 4 illustrates an example of signals generated during scan sessions and between scan sessions.
Figure 4:
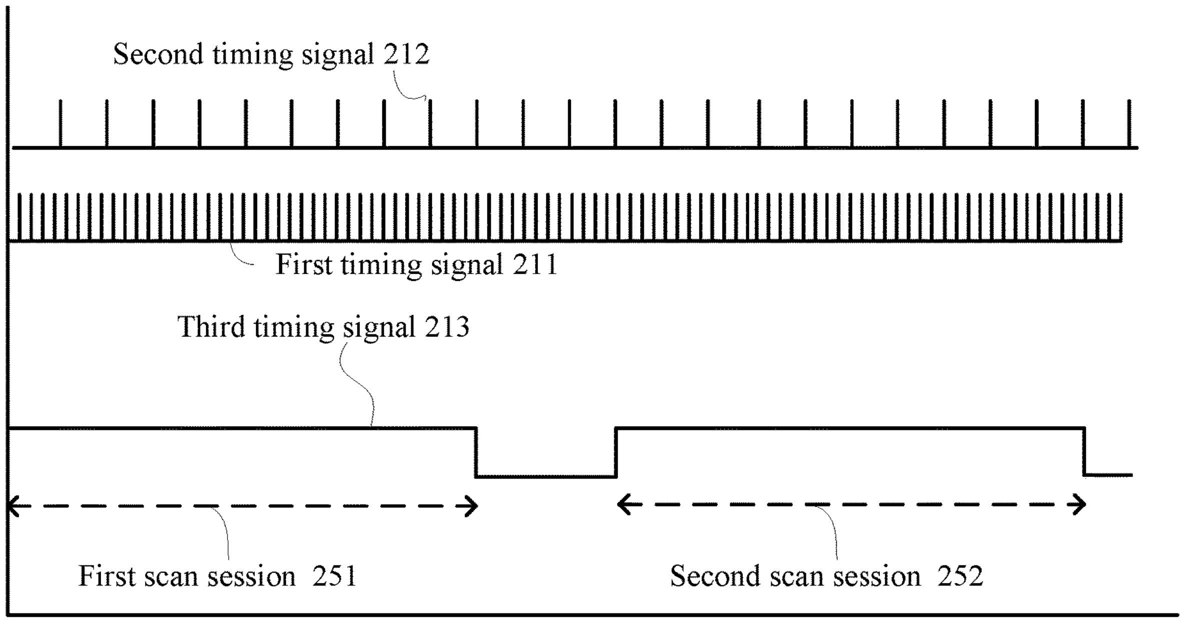

FIG. 4 includes a timing diagram 200-3 that illustrates a generation of the first timing signal 211 and a second timing signal 212 in a uninterrupted manner by the timing circuit during a first scan session 251, during a second scan session 252 and between the first scan session and the second scan session.

Timing diagram 200-3 also illustrates that the scan on signal 207 is aligned to the second timing signal 212.

FIG. 4 also includes timing diagram 200-4 that illustrates a generation of the first timing signal 211 and a second timing signal 212 in an uninterrupted manner by the timing circuit during a first scan session 251, during a second scan session 252 and between the first scan session and the second scan session. Timing diagram 200-4 also illustrates a third timing signal 213 that is set only during scan sessions such as first scan session 251 and second scan sessions 252, and is reset between scan sessions to prevent the generation of laser pulses between scan sessions even when the second timing signal is set.

Figure 5:
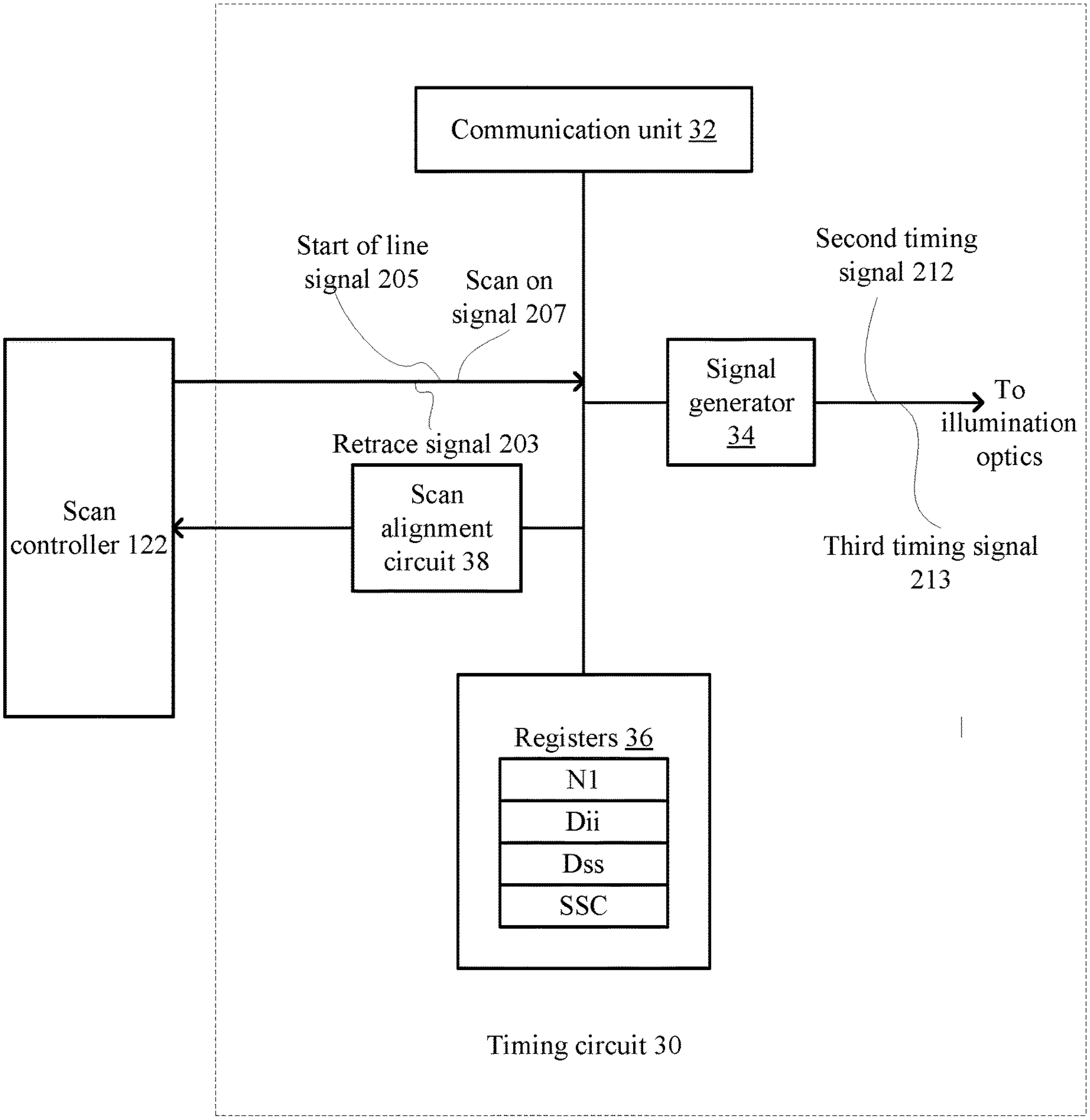
FIG. 5 illustrates an example of a timing circuit.

FIG. 5 illustrates an example of timing circuit 30 and scan controller 122.

The timing circuit 30 includes:

a. Communication unit 32 for communicating with illumination optics 20 and additionally or alternatively with scan controller 122 of the charged particle evaluation system, and additionally or alternatively a remote computerized system and additionally or alternatively any other circuit or unit of the charged particle evaluation system, and additionally or alternatively a storage or memory unit, and the like.
b. Scan alignment circuit 38 for aligning a scan on signal 207 with a first timing signal 211. The first timing signal 211 is a virtual start of line signal and may be generated in an uninterrupted manner even between scan sessions. The alignment may include delaying a scan on line signal till the next pulse of the first timing signal. The delay (start scan delay (Dss)) may be stored in a register of the timing circuit.
c. Signal generator 34 that is configured to generate one or more timing signals used to trigger the illumination iterations. The signal generator may generate second timing signal 212 and third timing signal 213 to be sent to the illumination optics and control a laser of the illumination optics. The signal generator may receive one or more control signals from the scan controller 122 and in turn align one or more timing signals generated by the signal generator 34 with the scanning. The one or more control signals may include start of line signal 205, retrace signal 203 and scan on signal 207.
d. Registers 36 for storing values such as N1, illumination iteration delay (Dii) between start of idle period during which an illumination iteration occurs and the start of the illumination iteration, start scan delay (Dss) between the first timing signal and the start of a scanning of a region. The register also stores a start scan command (SSC).

Figure 6:
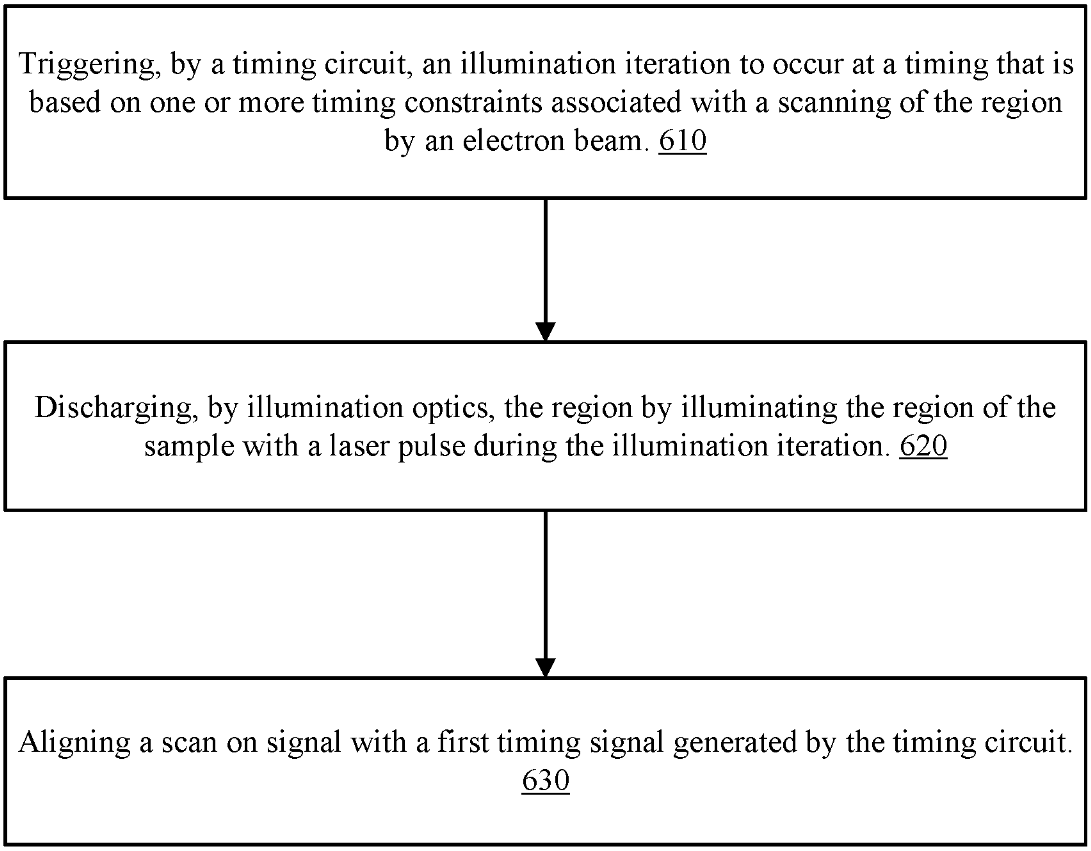
FIG. 6 illustrates an example of a method according to the present disclosure.

FIG. 6 illustrates an example of a method 600 for discharging a region of a sample.

Method 600 may be executed by the timing circuit and also may be executed by the illumination optics illustrated in any one of FIGS. 1-5.

Method 600 may start by step 610 of triggering, by a timing circuit, an illumination iteration to occur at a timing that is based on one or more timing constraints associated with a scanning of the region by an electron beam. The triggering may follow a reception of a start scan command. The one or more timing constraints may include at least one out of (a) a time difference between adjacent illumination iterations of the different illumination iterations, for example a time required to scan N1 lines of the region, (b) the timing of one or more idle periods, and the like.

The triggering may include generating, by the timing circuit, a second timing signal and a third timing signal, both explained in the above text. The triggering is responsive to one or more variables such as N1 and Dii.

Step 610 may be followed by step 620 of discharging, by illumination optics, the region of the sample by illuminating the region of the sample with a light, such as a laser pulse, during the illumination iteration.

Steps 610 and 620 may be executed multiple times.

Method 600 may also include step 630 of aligning a scan on signal with a first timing signal generated by the timing circuit. The aligning may be responsive to variable Dss.

FIG. 1 illustrates an illumination optics that directs the light (laser pulses 195) through the column. It should be noted that the light may propagate solely outside the column.

Figure 7:
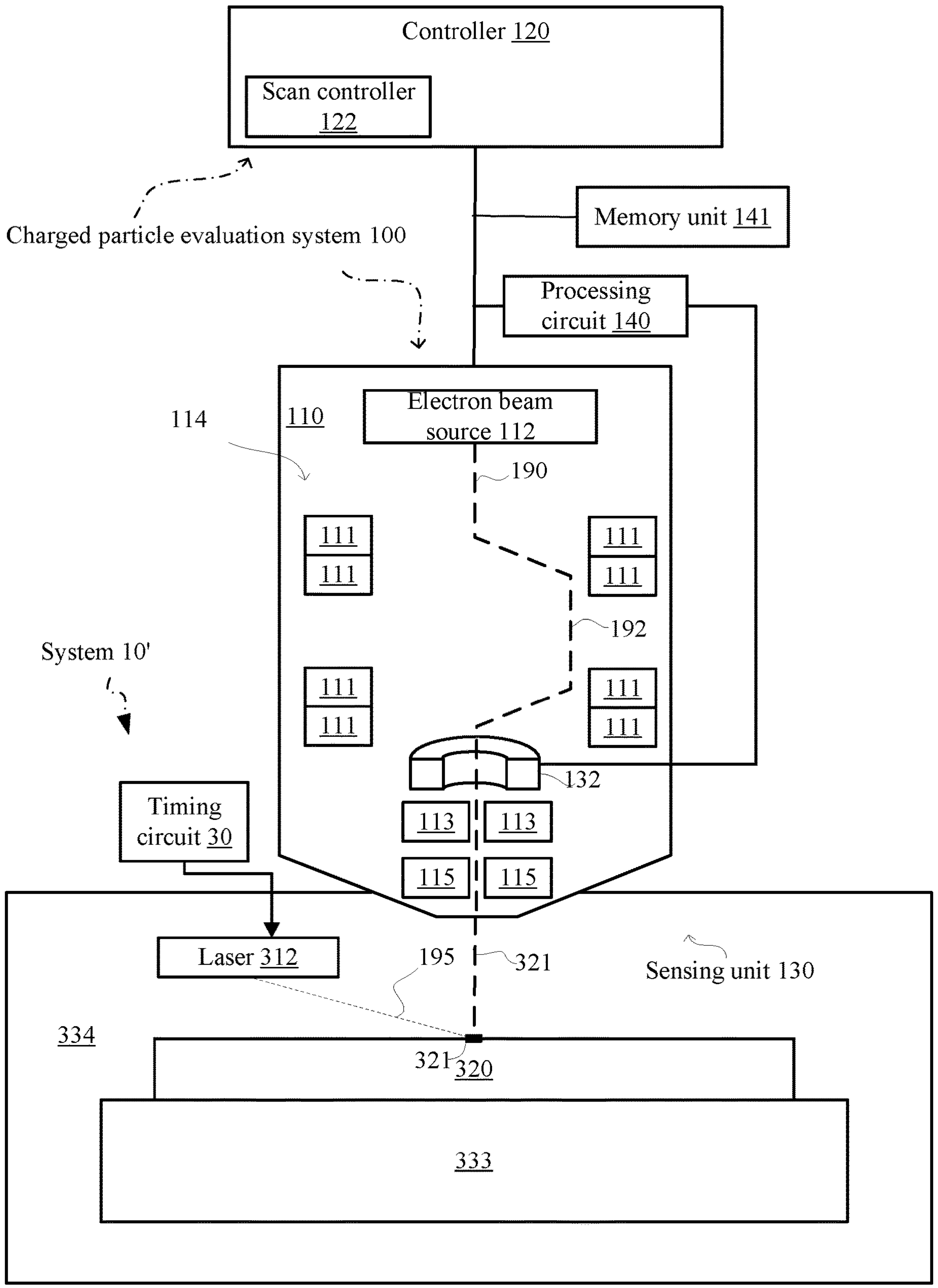
FIG. 7 illustrates an example of a system for discharging a region of a sample, and of an environment of the system.
Figure 8:
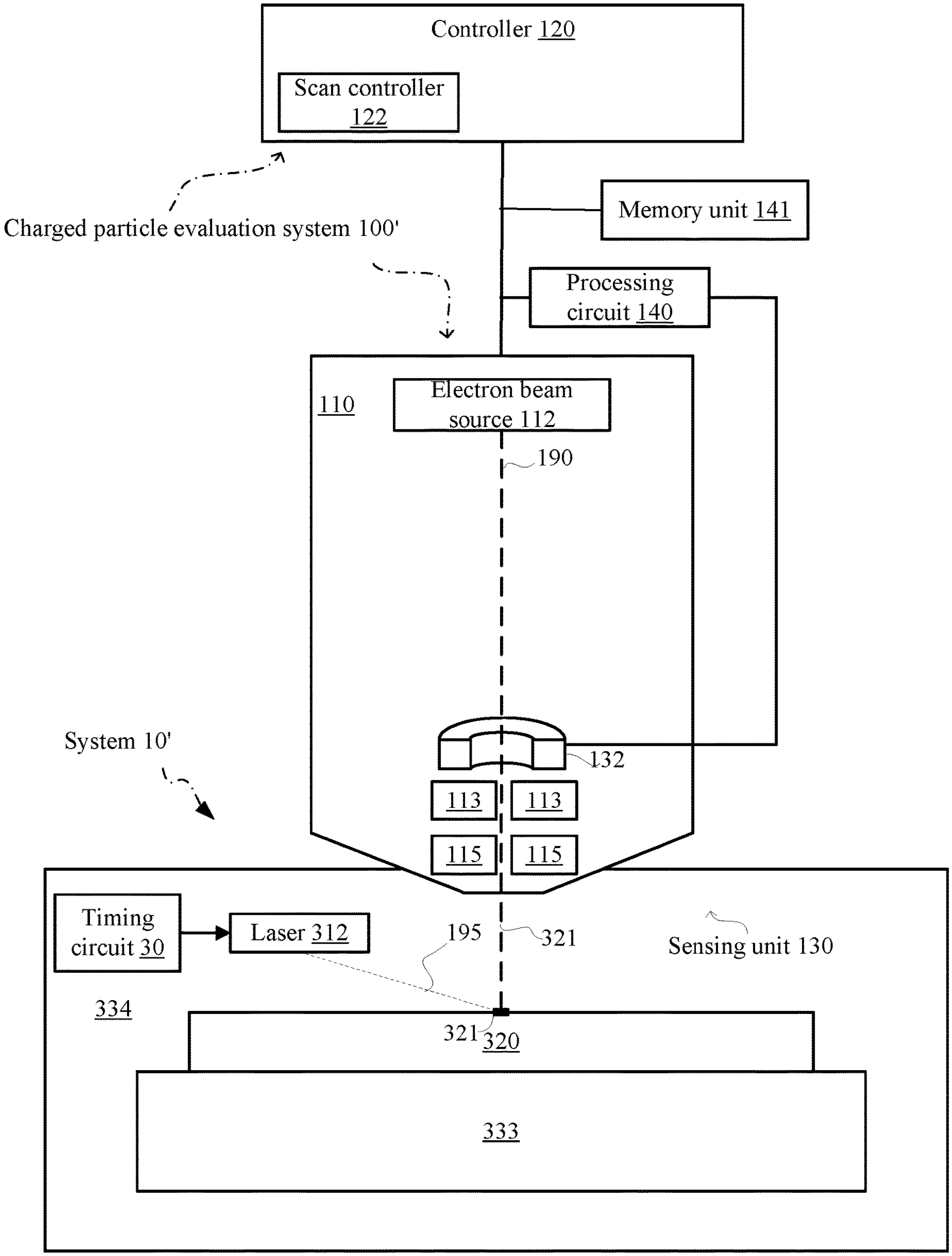
FIG. 8 illustrates an example of a system for discharging a region of a sample, and of an environment of the system.
Figure 9:
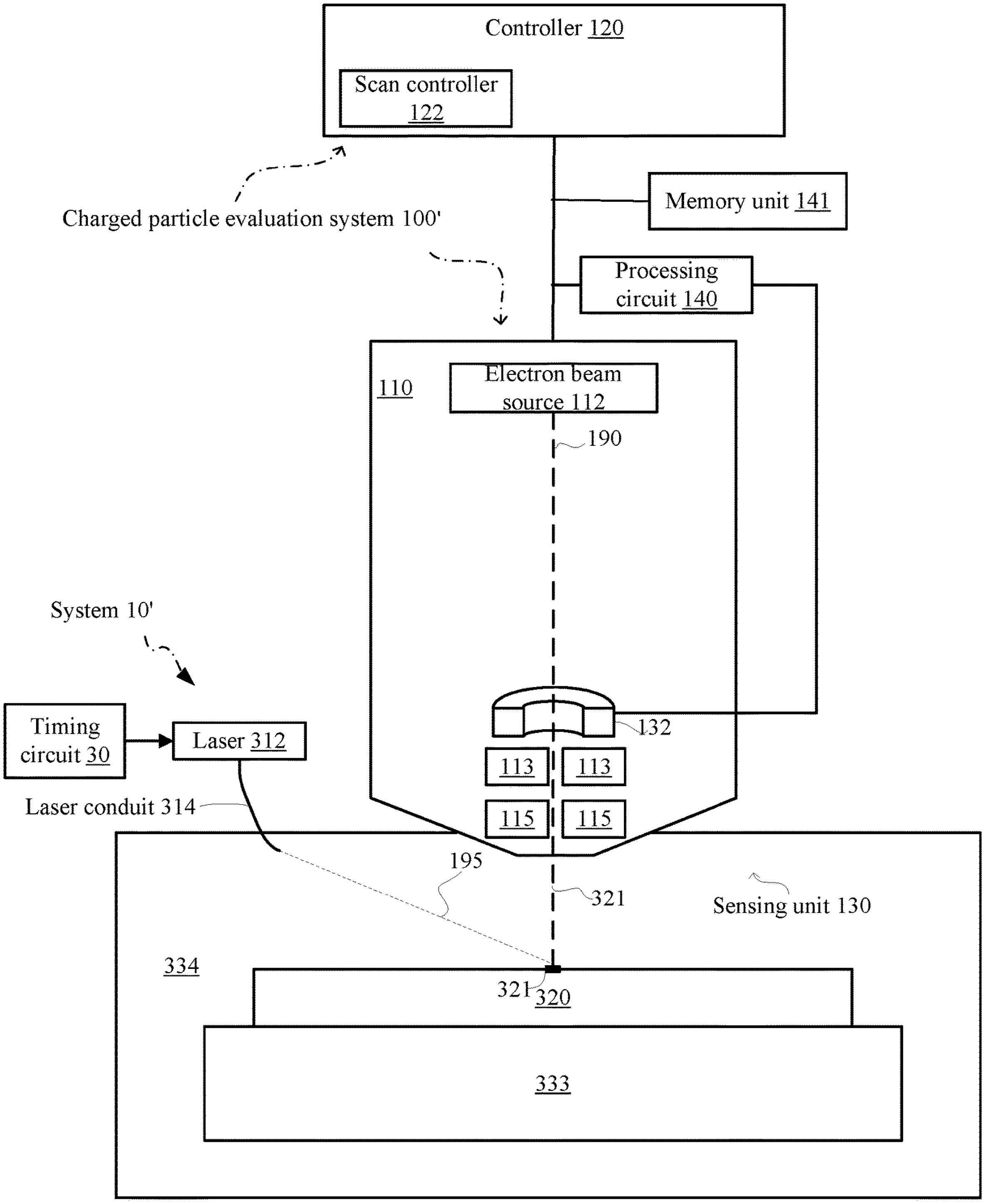
FIG. 9 illustrates an example of a system for discharging a region of a sample, and of an environment of the system.

FIGS. 7, 8 and 9 illustrates examples of a system 10' that includes timing circuit 30 and illumination optics that propagates the light outside the column.

System 10' does include a mirror (denoted 23 in FIG. 1) that is located within the column for directing the light through the column.

In FIG. 7, the illumination optics includes a laser 312 that is located within vacuum chamber 334, while the timing circuit 30 is located outside the vacuum chamber 334.

In FIG. 8, the illumination optics includes a laser 312 that is located within vacuum chamber 334, and the timing circuit 30 is also located within the vacuum chamber 334.

In FIG. 9, the illumination optics includes a laser 312 that is located outside the vacuum chamber 334. A laser conduit 314 (such as a laser fiber or other conduit) is in optical communication with the laser and has an input located outside the vacuum chamber and an output that is located within the vacuum chamber.

The timing circuit 30 is also located outside the vacuum chamber 334.

The charged particle evaluation system 100 of FIG. 7 is the same as the charged particle evaluation system 100 of FIG. 1.

FIGS. 8 and 9 illustrate charged particle evaluation system 100' that differ from the charged particle evaluation system 100 of FIG. 1 by the absence of the bypass magnetic scan coils (denoted 111 in FIG. 1), as there is no mirror to bypass within the column.

In the foregoing specification, the embodiments of the disclosure have been described with reference to specific examples of embodiments. It will, however, be evident that various modifications and changes may be made therein without departing from the broader spirit and scope of the appended claims.

Moreover, the terms “front,” “back,” “top,” “bottom,” “over,” “under” and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms “assert” or “set” and “negate” (or “deassert” or “clear”) are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any reference to the term “comprising” or “having” or “including” should be applied mutatis mutandis to “consisting” and additionally or alternatively should be applied mutatis mutandis to “consisting essentially of”.

Any arrangement of components to achieve the same functionality is effectively “associated” such that the desired functionality is achieved. Hence, any two components herein combined to achieve a particular functionality may be seen as “associated with” each other such that the desired functionality is achieved, irrespective of architectures or intermedial components. Likewise, any two components so associated can also be viewed as being “operably connected,” or “operably coupled,” to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word ‘comprising’ does not exclude the presence of other elements or steps then those listed in a claim. Furthermore, the terms “a” or “an,” as used herein, are defined as one or more than one. Also, the use of introductory phrases such as “at least one” and “one or more” in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for discharging different regions of a sample, the system comprising:

a detector configured to measure a surface potential or charging rate of each of different regions;

illumination optics configured to discharge the different regions by illuminating the different regions of the sample with laser pulses during illumination iterations; and a timing circuit configured to trigger the illumination iterations to occur at timings that are based on one or more timing constraints associated with a scanning of the different regions by an electron beam, wherein the timing circuit is further configured to adjust the timing or frequency of illumination iterations for the different regions in response to the measured surface potential or charging rate of each region to maintain the surface potential of the different regions within a predetermined neutral range suitable for stable imaging.

2. The system according to claim 1, wherein the scanning of the region occurs during a scanning period that comprises an idle period, wherein the timing circuit is configured to time the illumination iteration to occur during the idle period.

3. The system according to claim 1, wherein the illumination optics are configured to discharge the region during multiple illumination iterations, and wherein the timing circuit is configured to trigger the multiple illumination iterations to occur at timings that are based on the one or more timing constraints associated with the scanning of the region.

4. The system according to claim 3, wherein the scanning of the region occurs during a scanning period that comprises multiple idle periods, wherein the timing circuit is configured to time different illumination iterations of the multiple illumination iterations to occur during different idle periods of the multiple idle periods.

5. The system according to claim 4, wherein the different idle periods are only some of the multiple idle periods.

6. The system according to claim 4, wherein the one or more timing constraints comprise a time difference between adjacent illumination iterations of the different illumination iterations.

7. The system according to claim 6, wherein the timing circuit is configured to change the time difference.

8. The system according to claim 4, wherein the different idle periods occur during a single scan of the region by the electron beam.

9. The system according to claim 4, wherein the timing circuit is configured to generate a first timing signal that has a period that equals a time different between adjacent line scans.

10. The system according to claim 9, wherein the timing circuit is configured to generate a second timing signal for triggering the different illumination iterations.

11. The system according to claim 10, wherein the timing circuit is configured to maintain the generation of the second timing signal between a first scan session and a second scan session, wherein the first scan session comprises multiple illumination iterations.

12. The system according to claim 10, wherein the second timing signal has a second period that equals a time difference between adjacent illumination iterations.

13. The system according to claim 9, wherein the timing circuit is configured to align a start of a scan session with the first timing signal.

14. A method for discharging regions of a sample, the method comprising:

measuring, for each of a plurality of different regions of the sample, a surface potential or charging rate of that region;

triggering, by a timing circuit, illumination iterations to occur at timings that are based on one or more timing constraints associated with a scanning of the plurality of different regions by an electron beam; and discharging, by illumination optics, the regions by illuminating the regions of the sample with laser pulses during the illumination iterations;

wherein the timing circuit is further configured to adjust the timing or frequency of illumination iterations for different regions in response to the measured surface potential or charging rate of each region to maintain the surface potential of the different regions within a predetermined neutral range suitable for stable imaging.

15. A non-transitory computer readable medium that stores instructions that once executed by a timing circuit, causes the timing circuit to:

measure, for each of a plurality of different regions of the sample, a surface potential or charging rate of that region;

trigger, by a timing circuit, illumination iterations to occur at timings that are based on one or more timing constraints associated with a scanning of the plurality of different regions of a sample by an electron beam; wherein the illumination iteration comprises discharging, by illumination optics, the regions by illuminating the regions of the sample with laser pulses;

wherein the timing circuit is further configured to adjust the timing or frequency of illumination iterations for different regions in response to the measured surface potential or charging rate of each region to maintain the surface potential of the different regions within a predetermined neutral range suitable for stable imaging.

* * * * *